United States Patent [19]

Nishiyama et al.

[11] Patent Number: 5,236,895
[45] Date of Patent: Aug. 17, 1993

[54] PRODUCTION OF OXIDE SUPERCONDUCTING FILMS BY LASER SPUTTERING USING $N_2O$ OR $NO_2$

[75] Inventors: Yukio Nishiyama, Akashi; Shichio Kawai, Suita; Tomoji Kawai, Minoo; Hitoshi Tabata, Akashi; Osamu Murata, Kobe; Junzo Fujioka, Akashi, all of Japan

[73] Assignee: Kawasaki Jukogyo Kabushiki Kaisha, Hyogo, Japan

[21] Appl. No.: 735,175

[22] Filed: Jul. 23, 1991

Related U.S. Application Data

[63] Continuation of Ser. No. 447,498, Nov. 24, 1989, abandoned.

[30] Foreign Application Priority Data

Nov. 24, 1988 [JP] Japan .................. 63-297007

[51] Int. Cl.$^5$ .................. B05D 3/06; B05D 5/12
[52] U.S. Cl. .................. 505/1; 505/732; 505/730; 427/62; 427/596; 427/314
[58] Field of Search .................. 505/1, 731, 732, 730; 427/62, 53.1, 63, 314, 596; 204/192.24

[56] References Cited

U.S. PATENT DOCUMENTS 4,514,437 4/1985 Nath .................. 427/39
4,771,015 9/1988 Kanai et al. .................. 437/109

OTHER PUBLICATIONS

Berkley et al "In Situ Formation of Superconducting $YBa_2Cu_3O_{7-x}$ Thin Films Using Pure Ozone Vapor Deposition" Appl. Phys. Lett. 53(20) Nov. 1988 pp. 1973–1975.

Kanai et al. "Formation of Bi–Sr–Ca–Cu–O Thin Films by a Laser Sputtering Method " Jpn. J. Appl. Phys. vol. 27(7) Jul. 1988 L1293–1296.

Tsuroka et al "Y–Ba–Cu–O" Film Growth by OMCVD Using $N_2O$ Jpn. J. Appl. Phys vol. 28(10) Oct. 1989 L1800–1802.

Terashima et al "Preparation of Superconducting Y–Ba–Cu–O Films by a Reactive Plasma Evaporation Method" Appl. Phys Lett. 52(15) Apr. 1988 pp. 1274–1276.

Spah et al "Parameters for in Situ Growth of High $T_c$ Sperconducting Thin Films Using an Oxygen Plasma Source" Appl Phys. Lett. 53(5) Aug. 1988 pp. 441–443.

Kanai et al "Low-Temperature Formation of Multilayered Bi(Pb) –S r–Ca–Cu–O Thin Films by Successive Deposition Using Laser Ablation" Appl. Phys. Lett. 54(18) May 1989 pp. 1802–1804.

Witanachchi et al. "Deposition of Superconducting Y–Ba–Cu–O Films at 400° C. Without Post-Annealing" Appl. Phys. Lett. 53(3) Jul. 1988 pp. 234–236.

Inam et al, "As-deposited High $T_c$ and $J_c$ Superconducting Thin Films Made at Low Temperatures," Appl. Phys. Lett. 53(10) Sep. 1988 pp. 908–910.

*Primary Examiner*—Roy King
*Attorney, Agent, or Firm*—Wenderoth, Lind & Ponack

[57] ABSTRACT

There is provided in a process for depositing a metal oxide superconducting film on a substrate by laser sputtering, the improvement which comprises carrying out the deposition of the metal oxide superconducting film in the presence of a gas having higher oxidation potential than oxygen.

4 Claims, 2 Drawing Sheets

PRODUCTION OF OXIDE SUPERCONDUCTING FILMS BY LASER SPUTTERING USING $N_2O$ OR $NO_2$

This application is a continuation of now abandoned application Ser. No. 07/447,498 filed Nov. 24, 1989.

BACKGROUND OF THE INVENTION

This invention relates to a process for the production of superconducting films.

In recent years, intensive and extensive studies have been made of methods for producing high-temperature superconducting films.

Superconducting films are generally prepared by depositing a specific metal oxide on a substrate by means of the magnetron sputtering method, laser sputtering method, CVD (Chemical Vapor Deposition) method, MBE (Molecular Beam Epitaxy) method, and so on. In these methods, superconducting films having high Tc (critical temperature) have often been prepared successfully by carrying out high-temperature annealing after film deposition so as to adjust the oxygen concentration in the film. It is known, however, that the post-annealing is likely to cause various problems due to the high substrate temperature such as diffusion of substrate elements into films. This limits the practical utility of the resulting films, especially in their electronic device applications.

It has been proposed, on the other hand, to carry out the film deposition process in the presence of oxygen thereby effecting the adjustment of oxygen concentration during the formation of films without the need for post-annealing. This method enables the production of superconducting thin films at a substrate temperature which is to some extent lower than that required for the post-annealing. This method, however, still requires a considerably high substrate temperature in the order of 600°-900° C., and thus is still inadequate for applications in electronic devices. Accordingly, there has been a strong desire in the art to establish a technique which can substantially lower a substrate temperature in the film deposition process.

SUMMARY OF THE INVENTION

In view of the state of the art as described above, the present inventors have made intensive studies on a method which can produce superconducting films at a low substrate temperature. As a result, it was unexpectedly found by the inventors that a substrate temperature can be considerably lowered by using a specific gas instead of oxygen as conventionally used in the film deposition process.

Thus, according to the present invention, there is provided in a process for producing a superconducting film by the deposition of a metal oxide on a substrate, the improvement which comprises carrying out the deposition of the metal oxide in the presence of a gas having higher oxidation potential than oxygen.

According to the present invention, it is possible to prepare superconducting smooth films at a substrate temperature which is considerably lower than that employed in conventional processes using $O_2$.

DETAILED DESCRIPTION OF THE PREFERRED EMBODIMENTS

Figure 1:
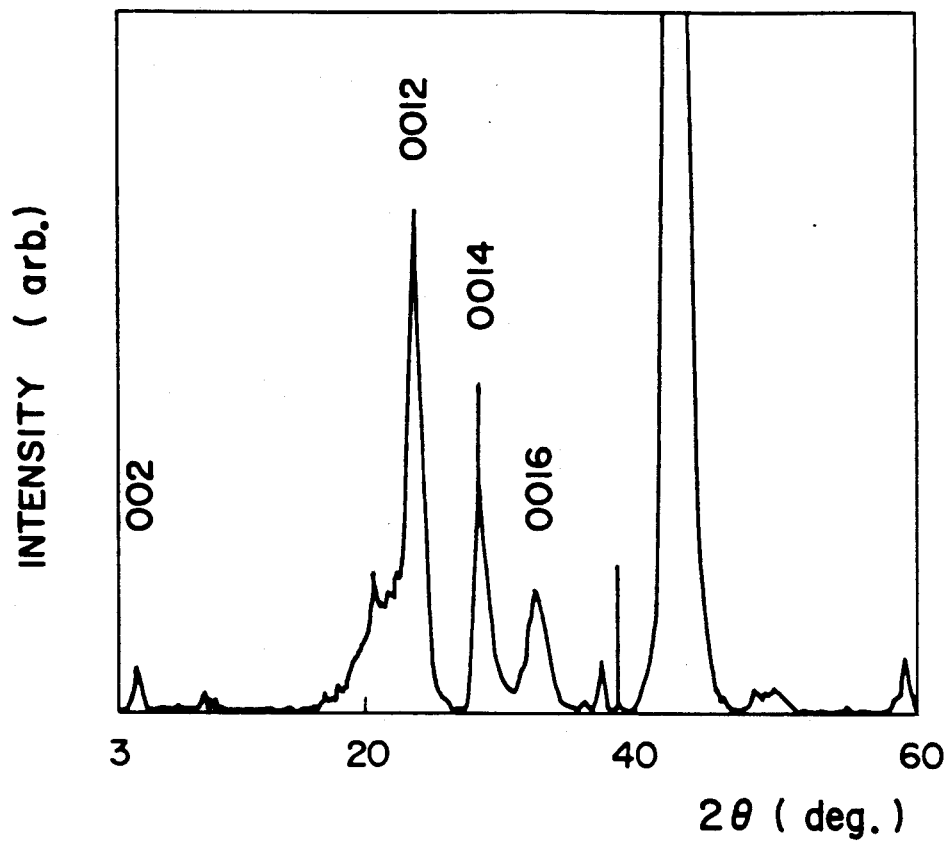
FIGS. 1, 2 and 3 show X-ray diffraction patterns of superconducting films obtained in Example 1, Comparative Example 1 and Example 2, respectively.

The superconducting films to be produced in the process according to the present invention are thin films of specific metal oxides showing superconducting transition at high Tc (critical temperature), e.g. about 75K-90K. Specific examples of such metal oxides are yttrium-based oxides such as an Y-Ba-Cu-O system, bismuth-based oxides such as a Bi-Sr-Ca-Cu-O system, thallium-based oxides such as a Tl-Ba-Ca-Cu-O system, neodymium-based oxides such as systems of Nd-Ce-Sr-Cu-O and Nd-Ce-Cu-O.

In the process of the present invention, superconducting films are prepared by depositing the above metal oxides on a substrate in the presence of a gas having higher oxidation potential than oxygen.

The deposition of metal oxide may be performed by known techniques including the laser sputtering method, magnetron sputtering method, MBE (Molecular Beam Epitaxy) method and CVD (Chemical Vapor Deposition) method.

In the laser sputtering method, for example, a laser beam is focussed on a target (metal oxide) to dissociate it into its atomic or ionic state and the atomic or ionic molecules of the target are deposited on a substrate to form a film. In this case, either a single target or a plurality of targets (multitarget) may be employed depending upon the composition and structure of a superconducting film to be produced.

The substrates on which superconducting films are formed according to the process of the present invention are not particularly limited; however, YSZ, $Al_2O_3$ (sapphire), $SrTiO_3$ and $LaAlO_3$ are preferred for the film formation of Y-based oxides, and MgO for Bi, Tl and Nd-based oxides.

According to the present invention, the deposition of metal oxide on a substrates is carried out in the presence of a gas having higher oxidation potential than oxygen. The "gas having higher oxidation potential" herein means atomic or ionic oxygen or a gas which can generate atomic or ionic oxygen by the action of heat and/or light. Specific examples of such gases may include nitrogen oxides such as $N_2O$, $NO$, $N_2O_3$, $NO_2$, $N_2O_4$, $N_2O_5$, $NO_3$ and $N_2O_6$, ozone ($O_3$), oxygen radical and atomic oxide. Among these gases, $N_2O$ and $NO_2$ are preferred. These gases may be used singly or in a mixture thereof. Moreover, these gases may also be used in a mixture with oxygen ($O_2$), and such mixture is herein included in the gas having higher oxidation potential than oxygen.

By carrying out the deposition of metal oxide on a substrate in the presence of the above specific gas, a considerable decrease in a substrate temperature during film formation is attained as compared with the conventional film deposition processes carried out in the presence of oxygen. In the film deposition process carried out by means of the laser sputtering method, for example, the substrate temperature is generally required to be held at 600°-850° C. in an $O_2$ ambient, whereas it may be lowered to be in the order of 450°-600° C. when using the above specific gas instead of $O_2$.

As the reason why superconducting films are produced at such a low temperature in accordance with the process of the present invention, the following consideration may be made.

Thus, taking now $N_2O$ gas as an example, $N_2O$ gas may dissociate at a relatively low temperature, e.g.

about 480° C., to produce oxygen in an activated state, and this active oxygen would promote crystallization of the deposited film, whereby crystallization of the film may be achieved at a lower substrate temperature than that in the conventional processes using $O_2$ ambient gas.

The pressure of the gas having higher oxidation potential than oxygen at which the film deposition is carried out according to the present invention may vary greatly depending upon the method adopted for carrying out the film deposition. Thus, the formation of superconducting films according to the process of the present invention is conducted generally at a gas pressure of $1 \times 10^{-3}$–10 Torr by the laser sputtering method, 0.01–0.1 Torr (as the sum with a sputtering gas pressure) by the magnetron sputtering method, $1 \times 10^{-9}$–$1 \times 10^{-6}$ Torr by the MBE method, and 1–10 Torr by the CVD method.

According to the present invention, as described hereinabove, superconducting films may be produced at a substantially lowered temperatures as compared with the conventional processes. The present invention thus provides a solution of the serious problem encountered in the conventional processes, i.e. the problem of diffusion of substrate elements into films or, adversely, diffusion of film elements into substrates due to the high substrate temperature. This means much for the application of superconducting films in electronic devices.

When considering, for example, the case where superconducting films are formed directly on a semiconductor substrate on which devices are previously fabricated, for using the formed film as wiring for IC, the formation of film must be conducted at a substrate temperature of less than 650° C., since otherwise the fabricated devices would be deteriorated. This substrate temperature of 650° C. is cleared by the process of the present invention which, as set forth above, enables the formation of superconducting films at a substrate temperature as low as 450°–600° C.

The present invention thus makes a great contribution in the art towards the realization of the practical use of superconducting films in the field of electronic devices.

The object of the examples that follow is to illustrate some embodiments of the present invention without implying any limitation.

EXAMPLE 1

A Bi-based oxide film was deposited on a MgO substrate held at 480° C. by the laser sputtering method under the following conditions, using as an apparatus for laser sputtering Lambda-Physik EMG 103-MSC (ArF 193 nm).

Target: $Bi_7Pb_3O_y$, $SrCuO_y$, $CaCuO_y$
Ambient gas: $N_2O$ gas stream ($10^{-1}$–1 Torr)
Laser intensity: 70 mJ/shot
Operation time: 40–60 min.
Laser repetition rate: 7–10 Hz.

Irradation of laser beam was carried out on the above three targets in a predetermined order thereby depositing a plurality of layers on the substrate in the predetermined order (this being the same in the following examples).

The film thus produced was confirmed to be a superconducting film by the X-ray diffraction pattern shown in FIG. 1, and the film had a Tc of about 80K.

COMPARATIVE EXAMPLE 1

Using the same apparatus as in Example 1, a Bi-based oxide film was deposited on a MgO substrate held at 600° C. by the laser sputtering method under the following conditions.

Target: $Bi_7Pb_3O_y$, $SrCuO_y$, $CaCuO_y$
Ambient gas: $O_2$ gas ($<10^{-3}$ Torr)
Laser intensity: 70 mJ/shot
Operation time: 60 min.
Laser repetition rate: 15–20 Hz.

Figure 2:
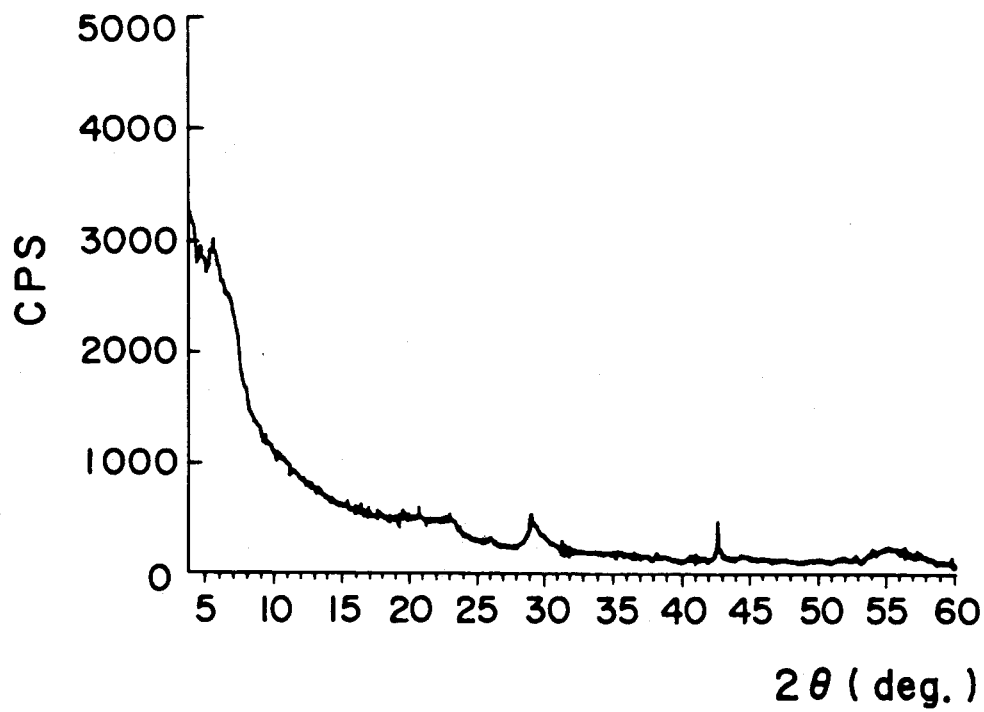

The X-ray diffraction pattern of the film thus produced (FIG. 2) shows weak and broad peaks, thus indicating inadequate crystallization of the film.

EXAMPLE 2

Using the same apparatus as in Example 1, an Y-based oxide film was deposited on a MgO substrate held at 500° C. by the laser sputtering method under the following conditions.

Target: $Y_2O_3$, BaO, CuO
Ambient gas: $N_2O$ gas stream ($10^{-1}$–1 Torr)
Laser intensity: 50 mJ/shot
Operation time: 60 min.
Laser repetition rate: 10–15 Hz.

Figure 3:
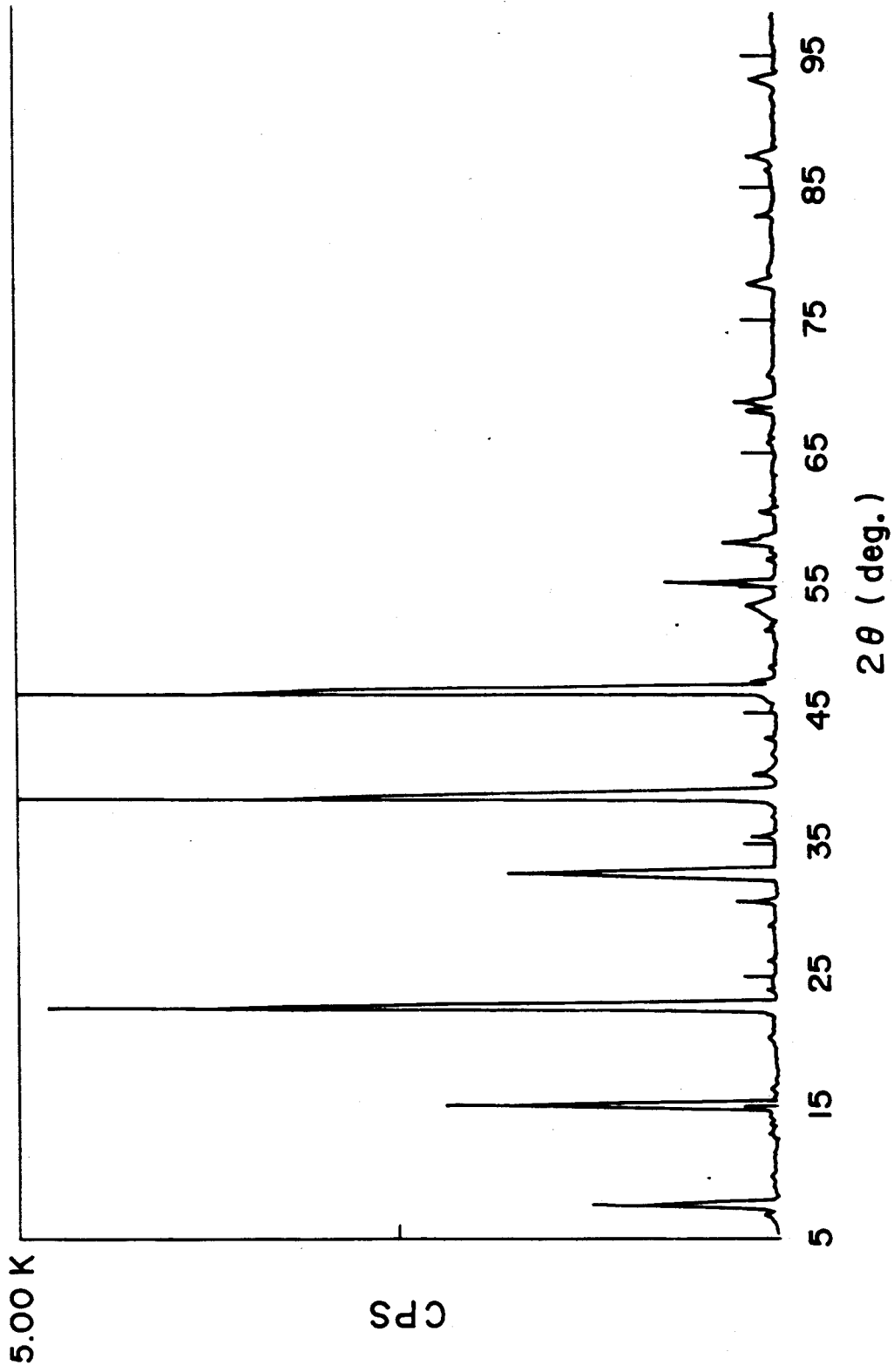

The film thus produced was confirmed to be a superconducting film by the X-ray diffraction pattern shown in FIG. 3, and the film had a Tc of about 90K.

COMPARATIVE EXAMPLE 2

An Y-based oxide film was deposited on a MgO substrate in the same manner as in Example 2 except for using $O_2$ ambient gas instead of $N_2O$ gas and changing the substrate temperature to 600° C.

The film thus produced was found to be inadequately crystallized by analysis of its X-ray diffraction pattern.

What is claimed is:

1. In a process for despositing a metal oxide superconducting film on a substrate by laser sputtering method, the improvement which comprises carrying out the deposition of the metal oxide superconducting film in the presence of $N_2O$ or $NO_2$.

2. The process according to claim 1, wherein the metal oxide superconducting film is selected from the group consisting of Y—Ba—Cu—O, Bi—Sr—Ca—Cu—O, Tl—Ba—Ca—Cu—O, Nd—Ce—Sr—Cu—O and Nd—Ce—Cu—O.

3. The process according to claim 1, wherein the substrate is selected from the group consisting of MgO, YSZ, $Al_2O_3$ (sapphire), $SrTiO_3$ and $LaAlO_3$.

4. The process according to claim 1, wherein the deposition of the metal oxide superconducting film is carried out at a substrate temperature of 450°–600° C.

* * * * *